(12) United States Patent
Yoshida

(10) Patent No.: US 8,499,443 B2
(45) Date of Patent: Aug. 6, 2013

(54) METHOD OF MANUFACTURING A PIEZOELECTRIC VIBRATOR

(75) Inventor: Yoshifumi Yoshida, Chiba (JP)

(73) Assignee: Seiko Instruments Inc., Chiba (JP)

( * ) Notice: Subject to any disclaimer, the term of this patent is extended or adjusted under 35 U.S.C. 154(b) by 27 days.

(21) Appl. No.: 12/984,188

(22) Filed: Jan. 4, 2011

(65) Prior Publication Data
US 2011/0163638 A1    Jul. 7, 2011

(30) Foreign Application Priority Data
Jan. 7, 2010   (JP) .................................. 2010-002360

(51) Int. Cl.
*H05K 3/20*   (2006.01)
*H04R 17/10*  (2006.01)

(52) U.S. Cl.
USPC ............... 29/842; 29/25.35; 29/417; 29/844; 29/854; 29/874; 174/262

(58) Field of Classification Search
USPC ............... 29/25.35, 830, 846, 852, 594, 412, 29/417, 842, 844, 874; 310/344; 83/688; 438/113; 174/262, 267
See application file for complete search history.

(56) References Cited

U.S. PATENT DOCUMENTS
4,739,687 A * 4/1988 Wanner et al. ................. 83/688
5,231,751 A * 8/1993 Sachdev et al. .............. 29/852
5,287,620 A * 2/1994 Suzuki et al. ................ 29/852
6,405,431 B1 * 6/2002 Shin et al. .................... 29/852
6,438,830 B1 * 8/2002 Dibble et al. .............. 29/842 X
2009/0013519 A1 * 1/2009 Park et al. .................... 29/594

FOREIGN PATENT DOCUMENTS
JP   06132757 A   * 5/1994   ............. 29/25.35
JP   2002-121037 A   4/2002
JP   2002-124845 A   4/2002
JP   2003-209198 A   7/2003

OTHER PUBLICATIONS
Machine Language Translation of Japanese Patent Publication JP 2003-209198.*

* cited by examiner

*Primary Examiner* — A. Dexter Tugbang
(74) *Attorney, Agent, or Firm* — Brinks Hofer Gilson & Lione

(57) ABSTRACT

A package manufacturing method capable of easily manufacturing a penetration electrode-attached base board having excellent shape accuracy with a high degree of flatness without forming cracks or the like is provided. The package manufacturing method includes an insertion hole forming step of forming insertion holes in one surface of a base board wafer so as not to penetrate through the base board wafer; a core portion insertion step of inserting conductive core portions made of a metal material into the insertion holes; a welding step of heating the base board wafer to a temperature higher than the softening point of the glass material so as to weld the base board wafer to the core portions while holding the one surface side of the base board wafer with a receiving mold and pressing the other surface of the base board wafer with a flat pressurizing mold; a cooling step of cooling the base board wafer; and a polishing step of polishing both surfaces of the base board wafer.

10 Claims, 13 Drawing Sheets

METHOD OF MANUFACTURING A PIEZOELECTRIC VIBRATOR

RELATED APPLICATIONS

This application claims priority under 35 U.S.C. §119 to Japanese Patent Application No. 2010-002360 filed on Jan. 7, 2010, the entire content of which is hereby incorporated by reference.

BACKGROUND OF THE INVENTION

1. Field of the Invention

The present invention relates to a method for manufacturing a package for electronic components including a plurality of boards which are bonded to each other so as to form a cavity at an inner side thereof and penetration electrodes that electrically connect the inside of the cavity to the outside of a base board among the plural boards.

2. Description of the Related Art

Recently, piezoelectric vibrators utilizing quartz crystal or the like have been used in cellular phones and portable information terminals as the time source, the timing source of a control signal or the like, a reference signal source, and the like. Although there are various piezoelectric vibrators of this type, an SMD (Surface Mount Device)-type piezoelectric vibrator is one known example thereof. As the piezoelectric vibrator of this type, a three-layered piezoelectric vibrator in which a piezoelectric board having a piezoelectric vibrating reed formed thereon is bonded to be interposed between the base board and a lid board is generally known. In this case, the piezoelectric vibrating reed is mounted on the base board and accommodated in a cavity that is formed between the base board and the lid board.

Moreover, in recent years, instead of the three-layered piezoelectric vibrator, a two-layered piezoelectric vibrator has also been developed. The piezoelectric vibrator of this type has a two-layered structure in which a base board and a lid board are directly bonded and packaged, and a piezoelectric vibrating reed is accommodated in a cavity formed between the two boards. The two-layered piezoelectric vibrator is suitably used in that it is excellent in achieving a thin profile compared with the three-layered structure.

As an example of a method for manufacturing such a packaged two-layered piezoelectric vibrator, a package manufacturing method in which a conductive member such as a silver paste is filled in penetration holes formed in a base board made of a glass material and baked so as to form penetration electrodes, and quartz crystal vibrating reeds in a cavity are electrically connected to the outer electrodes provided outside the base board is known. However, according to this method, there is a case where since a very small gap is present between the penetration holes and the conductive member, outer air enters into the package to deteriorate the degree of vacuum of the inside of the package, and as a result, causing deterioration in the properties of a quartz crystal vibrator. As countermeasures thereof, as proposed in JP-A-2003-209198, JP-A-2002-121037, and JP-A-2002-124845, a method of preventing deterioration of the degree of vacuum by inserting core portions made of a conductive metallic material into the penetration holes formed in a base board wafer and heating the core portions and the base board wafer to a temperature equal to or higher than the softening point of the glass so as to weld the glass and the electrode pins to each other is known.

However, in the method disclosed in JP-A-2003-209198, JP-A-2002-121037, and JP-A-2002-124845, penetration holes for inserting core portions are formed in the base board wafer using penetration hole forming pins while heating the base board wafer made of a glass material. Therefore, the glass material will swell up from both surfaces of the base board wafer near portions where the penetration holes are opened. Moreover, when the base board wafer is welded to the core portions, both ends of the core portions inserted into the penetration holes protrude from the base board wafer. Therefore, when both surfaces of the base board wafer are polished in a subsequent step to manufacture a base board having high shape accuracy with a high degree of flatness, the swelling of the glass material on both surfaces of the base board wafer and the protruding core portions become obstacles at the time of polishing, and the polishing cannot be performed well. Even if it is possible to polish both surfaces, cracks may be formed in the glass material near the core portions to cause short-circuiting of the electrode film, and a glass board wafer may be broken. In addition, the degree of flatness of the glass board wafer becomes greatly uneven.

Moreover, since the core portions have an approximately cylindrical shape, it is difficult to insert the core portions into the penetration holes of the base board wafer, the core portions are easily displaced during the welding, and thus the workability is poor.

SUMMARY OF THE INVENTION

The present invention has been made in view of the above problems, and an object of the present invention is to provide a package manufacturing method capable of easily manufacturing a penetration electrode-attached base board having excellent shape accuracy with a high degree of flatness without forming cracks or the like.

The present invention provides the following means in order to solve the problems.

According to an aspect of the present invention, there is provided a method for manufacturing a package including plural boards bonded to each other so as to form a cavity at an inner side and penetration electrodes that electrically connect the inside of the cavity to the outside of a base board made of a glass material among the plural boards, the method including: an insertion hole forming step of forming insertion holes in one surface of a base board wafer so as not to penetrate through the base board wafer; a core portion insertion step of inserting conductive core portions made of a metal material into the insertion holes; a welding step of heating the base board wafer to a temperature higher than the softening point of the glass material so as to weld the base board wafer to the core portions while holding the one surface side of the base board wafer with a receiving mold and pressing the other surface of the base board wafer with a flat pressurizing mold; a cooling step of cooling the base board wafer; and a polishing step of polishing both surfaces of the base board wafer.

According to the above aspect of the present invention, the insertion holes for inserting the core portions later serving as the penetration electrodes into the base board wafer are formed on the one surface of the base board wafer so as not to penetrate through the base board wafer. Therefore, the other surface of the base board wafer becomes flat with no swelling of the glass material. When the base board wafer is welded to the core portions inserted into the insertion holes, the other surface of the base board wafer, namely the flat surface where the insertion holes are not opened is similarly pressed by the flat pressurizing mold. As a result, the other surface of the base board wafer after the cooling step becomes flat. By using the other surface as a reference surface of the polishing, both surfaces of the base board wafer can be polished with a good accuracy.

In the package manufacturing method according to the above aspect of the present invention, each of the insertion hole may have an approximately truncated conical shape of which the diameter of a side opened to the one surface of the base board wafer is large, and each of the core portions may have an approximately truncated conical shape corresponding to the insertion holes.

According to the above aspect of the present invention, the insertion holes formed in the base board wafer are configured as depressions having an approximately truncated conical shape, and the core portions inserted into the insertion holes also have a corresponding approximately truncated conical shape. Therefore, it is possible to easily insert the core portions into the base board wafer, the core portions are rarely displaced during the welding, and workability can be improved.

In the package manufacturing method according to the above aspect of the present invention, each of the core portions may have a shape which is formed by an approximately truncated conical tip end that is inserted into each of the insertion holes and an approximately cylindrical termination end that is connected to a large diameter side of the truncated conical tip end.

According to the above aspect of the present invention, each core portion is formed by the approximately truncated conical tip end that is inserted into each of the insertion holes of the base board wafer and an approximately cylindrical termination end. Therefore, by holding the approximately cylindrical termination ends of the core portions during the welding, it is possible to certainly suppress the displacement of the core portions during the welding.

According to another aspect of the present invention, there is provided a piezoelectric vibrator in which a piezoelectric vibrating reed mounted on the base board is accommodated in a cavity of the package manufactured by the package manufacturing method according to the above aspect of the present invention. According to a further aspect of the present invention, there is provided an oscillator including the piezoelectric vibrator according to the above aspect of the present invention and an integrated circuit to which the piezoelectric vibrator is electrically connected as an oscillating piece.

According to the above aspect of the present invention, the other surface of the base board wafer after the cooling step in which no insertion hole is formed becomes flat. By using the other surface as a reference surface at the time of polishing, both surfaces of the base board wafer can be polished easily. Therefore, it is possible to easily manufacture a penetration electrode-attached base board having an excellent shape accuracy with a high degree of flatness without forming cracks which cause short-circuiting or the like of an electrode film.

DETAILED DESCRIPTION OF THE PREFERRED EMBODIMENTS

Figure 1:
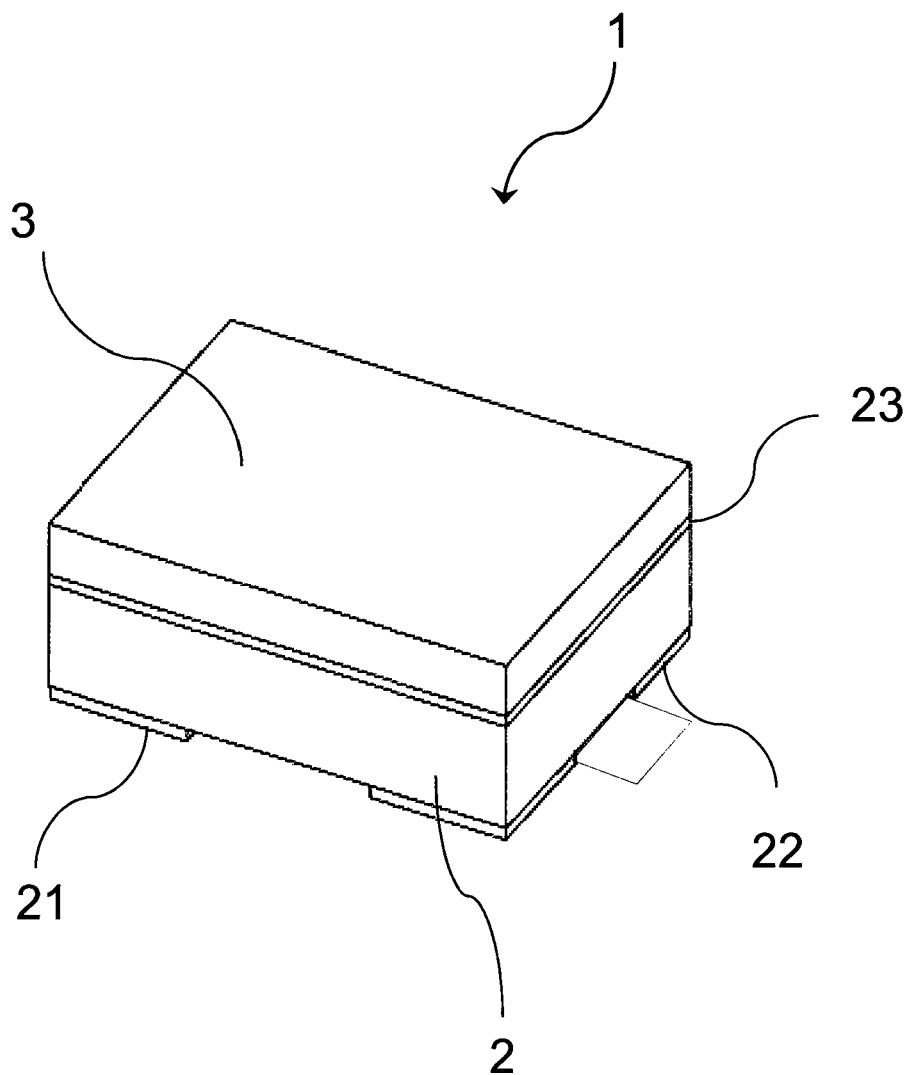
FIG. 1 is a perspective view showing an external appearance of an example of a piezoelectric vibrator according to an embodiment of the present invention.

Hereinafter, a package manufacturing method according to an embodiment of the present invention will be described with reference to FIGS. 1 to 12. In the present embodiment, a piezoelectric vibrator which is an example of a package will be described. However, the package may not always be the piezoelectric vibrator but may be ICs, LSIs, and sensors.

As shown in FIGS. 1 to 4, a piezoelectric vibrator 1 according to the present embodiment is an SMD (Surface Mount Device)-type piezoelectric vibrator which is formed in the form of a box laminated in two layers of a base board 2 and a lid board 3 and in which a piezoelectric vibrating reed 4 is accommodated in a cavity 3a at an inner portion thereof. The piezoelectric vibrating reed 4 and outer electrodes 21 and 22 which are provided at an outer side of the base board 2 are electrically connected to each other by a pair of penetration electrodes 8 and 9 penetrating through the base board 2.

The base board 2 is a transparent insulating board made of a glass material, for example, soda-lime glass, and is formed in a board-like form. The base board 2 is formed with the pair of penetration electrodes 8 and 9. The lid board 3 is a transparent insulating board made of a glass material, for example, soda-lime glass, similarly to the base board 2, and is formed in a board-like form having a size capable of being superimposed onto the base board 2. On a bonding surface side of the lid board 3 to be bonded with the base board 2, the lid board 3 is formed with a rectangular recess portion 3a in which the piezoelectric vibrating reed 4 is accommodated. The recess portion 3a becomes the cavity 3a that accommodates the piezoelectric vibrating reed 4 when the base board 2 and the lid board 3 are superimposed onto each other. The lid board 3 is anodically bonded or fusion bonded to the base board 2 with a bonding film 23 disposed therebetween in a state where the recess portion 3a faces the base board 2.

The piezoelectric vibrating reed 4 is a rectangular plate-like vibrating reed which is made of a piezoelectric material such as quartz crystal, lithium tantalate, or lithium niobate and is configured to vibrate when a predetermined voltage is applied thereto. In the present embodiment, the piezoelectric vibrating reed 4 is an AT-cut quartz crystal vibrating reed, for example. The piezoelectric vibrating reed 4 includes a pair of excitation electrodes 5 and 6 which are formed on the outer surface thereof so as to produce thickness-shear vibration, and a pair of mount electrodes 16 and 17 which are electrically connected to the pair of excitation electrodes 5 and 6. The piezoelectric vibrating reed 4 has a base portion which is bonded to the upper surface of the base board 2 by conductive adhesives 18 and 19 (or metal bumps), whereby the piezoelectric vibrating reed 4 is mounted on the base board 2.

The first excitation electrode 5 of the piezoelectric vibrating reed 4 is electrically connected to the one outer electrode 21 by the one mount electrode 16, a pad electrode 13 on the base board 2, and the one penetration electrode 8. The second excitation electrode 6 of the piezoelectric vibrating reed 4 is electrically connected to the other outer electrode 22 by the other mount electrode 17, a pad electrode 14 on the base board 2, a lead-out electrode 15, and the other penetration electrode 9. The mount electrodes 16 and 17 of the piezoelectric vibrating reed 4 and the pad electrodes 13 and 14 formed on the base board 2 so as to be connected to the penetration electrodes 8 and 9 are connected to each other by flip-chip bonding or the like using the adhesives 18 and 19 made of a conductive material or metal bumps. The pad electrode 14 on the base board 2 is connected to the other penetration electrode 9 through the lead-out electrode 15 connected thereto. The outer electrodes 21 and 22 are two terminals arranged on a diagonal line among four terminals provided at four corners of the bottom surface of the base board 2 and are electrically connected to the penetration electrodes 8 and 9.

The penetration electrodes 8 and 9 are formed by arranging core portions 31 made of conductive metal material in the base board 2, and stable electrical conduction is secured by the core portions 31. The one penetration electrode 8 is positioned above the outer electrode 21 and below the pad electrode 13 on the base board 2. The other penetration electrode 9 is positioned above the outer electrode 22 and below the lead-out electrode 15.

Figure 2:
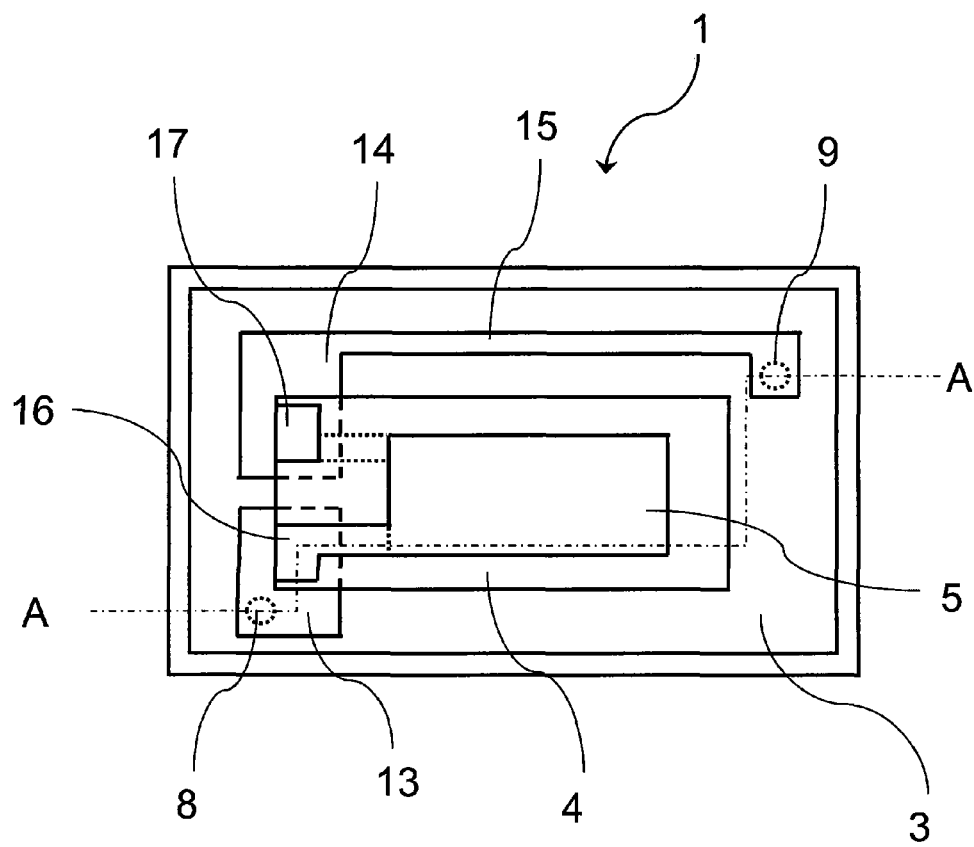
FIG. 2 is a top view of the piezoelectric vibrator shown in FIG. 1 with a lid board removed.
Figure 3:
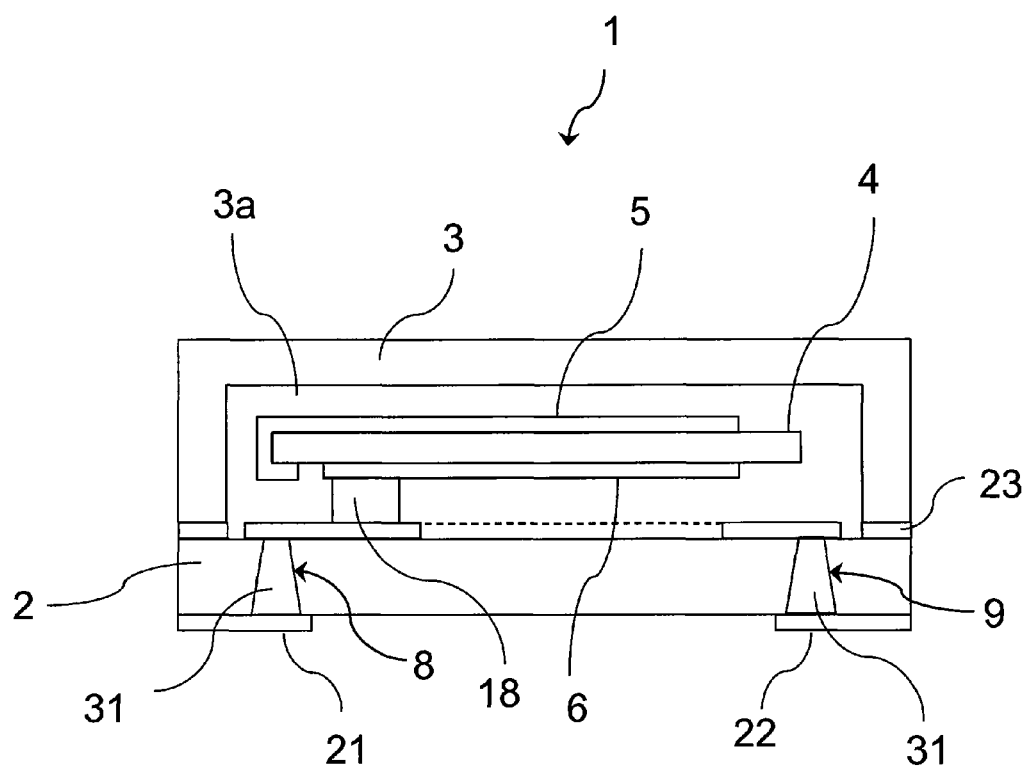
FIG. 3 is a sectional view taken along the line A-A in FIG. 2.
Figure 4:
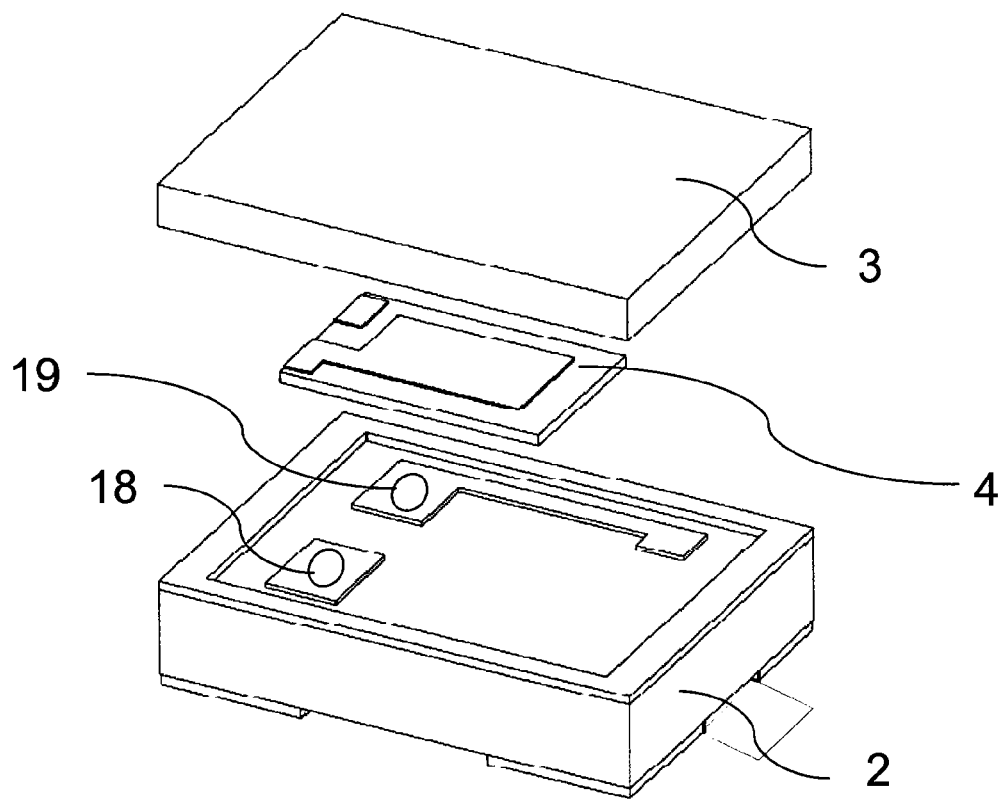
FIG. 4 is a perspective view showing a mounting form of the piezoelectric vibrator according to the embodiment of the present invention.
Figure 5:
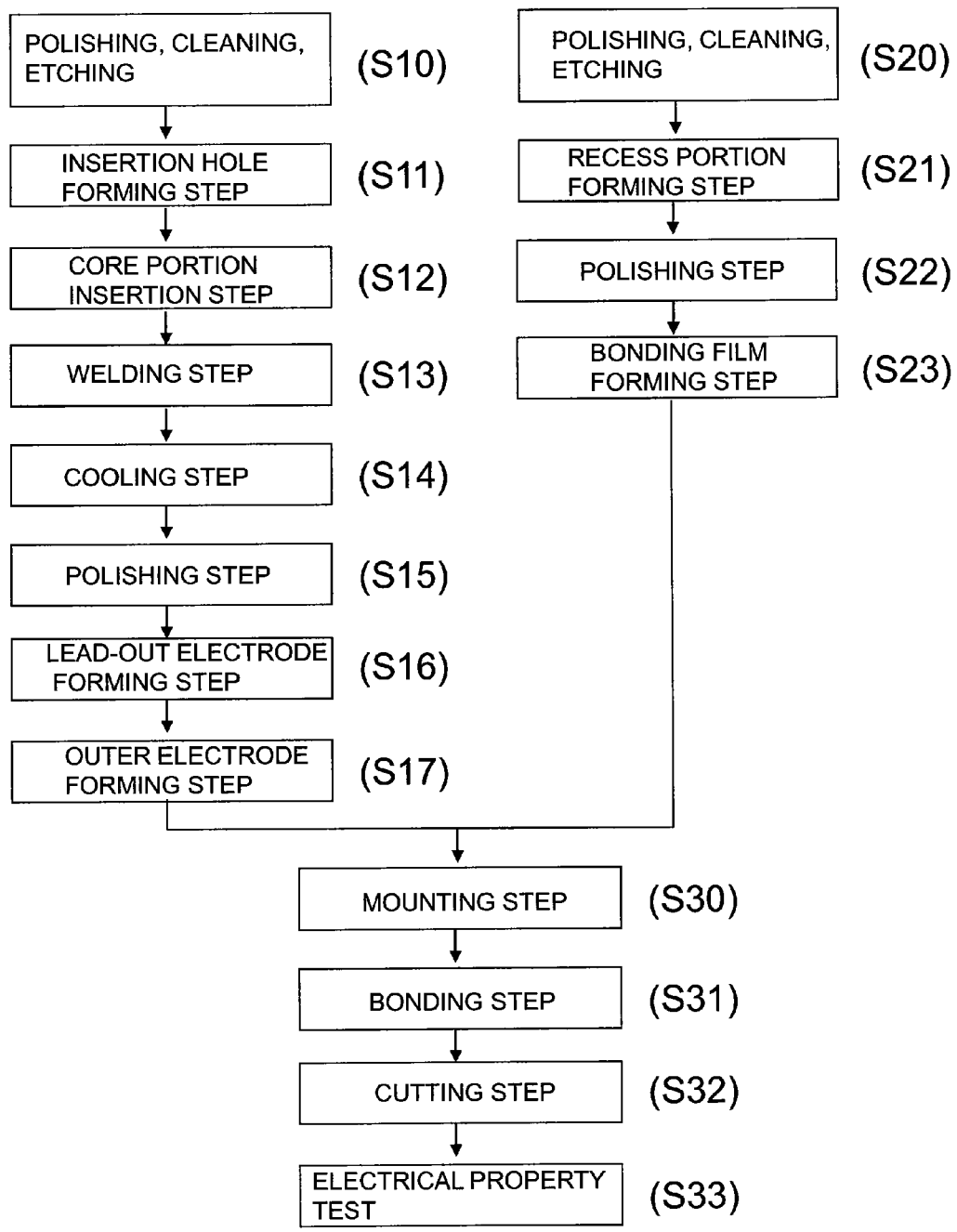
FIG. 5 is a flowchart showing the flow of the manufacturing process of the piezoelectric vibrator shown in FIG. 1.

As shown in FIGS. 1 and 2, the core portion 31 has an approximately truncated conical shape such that one end having an approximately circular shape with a small diameter and a small sectional area and the other end having an approximately circular shape with a large diameter and a large sectional area are smoothly connected to be approximately coaxial to each other. The core portion 31 has the one end having a small diameter being exposed to the upper surface of the base board 2 and has the other end having a large diameter exposed to the bottom surface of the base board 2. That is, the length of the core portion 31 is the same as the thickness of the base board 2. The core portion 31 is fixed to the base board 2 made of glass material by welding, and the core portion 31 completely closes insertion holes 55, 56 described later, thus maintaining the air-tightness of the inside of the cavity 3a. The core portion 31 is formed of a conductive metal material, for example, kovar and Fe—Ni alloys (42 alloy), whose thermal expansion coefficient is close to (preferably, equal to or lower than) that of the glass material of the base board 2.

Figure 9:
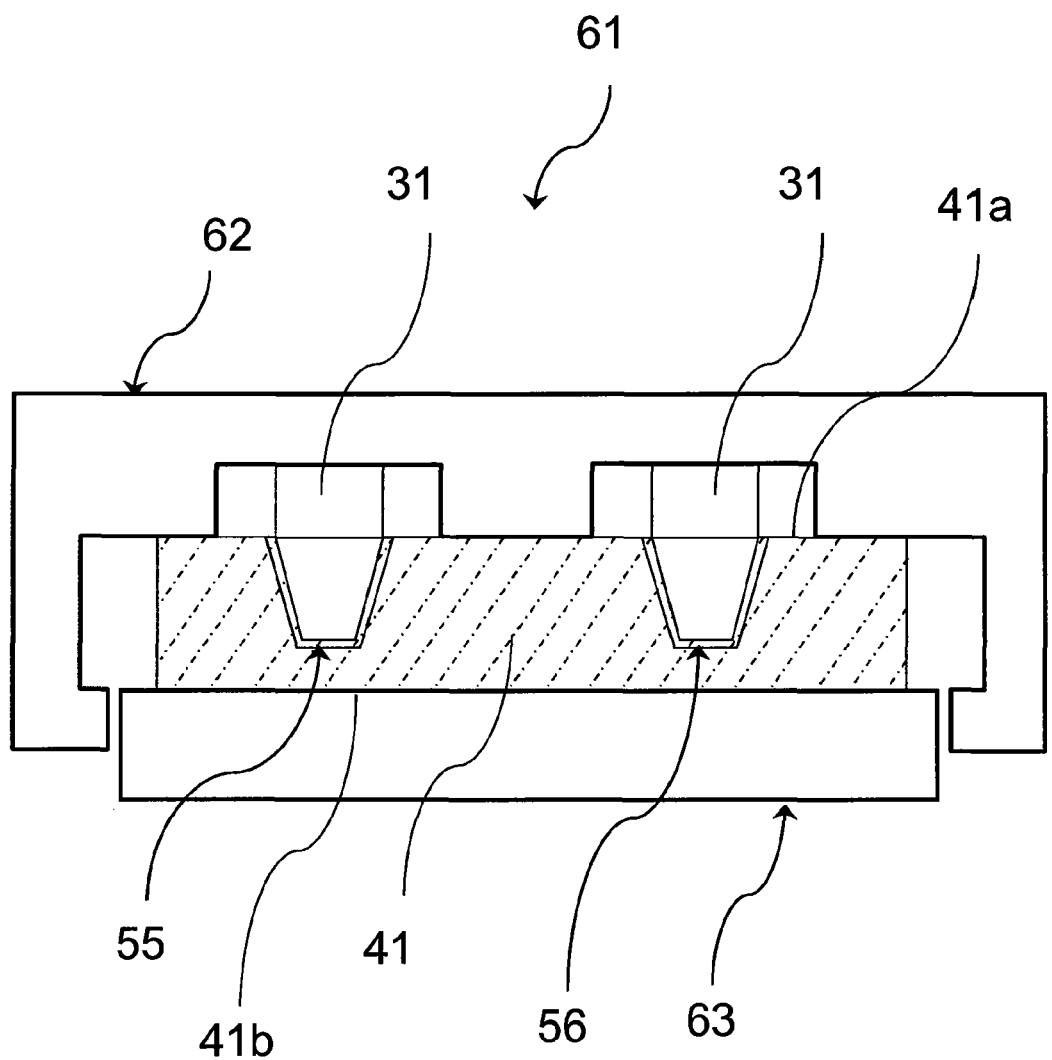
FIG. 9 is a diagram illustrating the core portion insertion step in the flowchart shown in FIG. 5, showing a state where the core portions are inserted into the insertion holes.

When the penetration electrodes 8 and 9 are formed as a finished product, the core portion 31 has an approximately truncated conical shape such that the thickness of the base board 2 is the same as the length of the core portion 31 as described above. However, in the course of the manufacturing process, the core portion 31 has a shape which is formed by a tip end 81 having an approximately truncated conical shape and a termination end 82 having an approximately cylindrical shape connected to the large diameter side. Moreover, in the course of the manufacturing process, the length of the core portion 31 is greater than the thickness of a base board wafer 41 later serving as the base board 2. Furthermore, as shown in FIG. 9, in a state where the core portion 31 is inserted into the insertion holes 55 or 56, the termination end 82 (the approximately cylindrical portion) of the core portion 31 protrudes from one surface 41a of the base board wafer 41. The termination end 82 of the core portion 31 protruding from the surface 41a of the base board wafer 41 is polished and removed in the course of the manufacturing process.

Package Manufacturing Method

Next, a method for manufacturing a package (piezoelectric vibrator) accommodating the piezoelectric vibrating reed will be described with reference to FIGS. 5 to 12.

First, a step of manufacturing a base board wafer 41 later serving as the base board 2 is performed. First, the base board wafer 41 is formed. Specifically, a soda-lime glass is polished to a predetermined thickness and cleaned, and then, the affected uppermost layer is removed by etching or the like (S10). Subsequently, the penetration electrodes 8 and 9 are formed on the base board wafer 41 (S11 to S15).

Insertion Hole Forming Step

First, insertion holes that can be frustoconical in shape are formed in the base board wafer 41 (S11). The forming of the insertion holes is performed by heating the base board wafer 41 while pressing the base board wafer 41 with an insertion hole forming mold 50, or a die, made of a carbon material and having a planar portion 51 and convex portions 52 formed on one surface of the planar portion 51 and a receiving mold 53 similarly made of a carbon material as shown in FIGS. 6 and 7.

The receiving mold 53 is a flat member which makes contact with the other surface 41b of the base board wafer 41 when pressing the base board wafer 41. The planar portion 51 of the insertion hole forming mold 50 is a flat member which makes contact with the one surface 41a of the base board wafer 41 when pressing the base board wafer 41. The one surface 41a of the base board wafer 41 serves as the bottom surface of the base board 2. The convex portions 52 of the insertion hole forming mold 50 is a member which transfers the shapes of the convex portions 52 to the base board wafer 41 to form depressions serving as the insertion holes 55 and 56 when pressing the base board wafer 41. The convex portions 52 have a tapered side surface for mold removal on the side surface thereof, and the approximately truncated conical shapes of the convex portions 52 are transferred to the insertion holes 55 and 56. The insertion holes 55 and 56 have an approximately truncated conical shape of which the diameter of a side opened to the one surface 41a of the base board wafer 41 is large. At this time, the insertion holes 55 and 56 are formed such that the inner diameter thereof is about 20 to 30 μm larger than the diameter of the core portion 31. The base board wafer 41 is welded to the core portions 31 in a later manufacturing step, whereby the insertion holes 55 and 56 are closed by the core portions 31.

Figure 6:
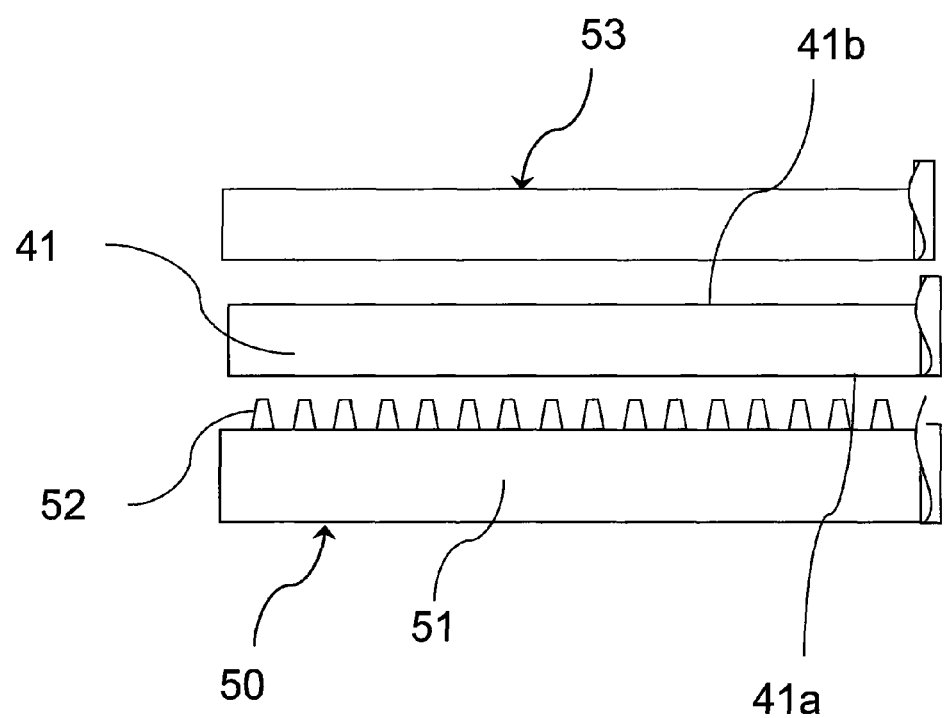
FIG. 6 is a diagram illustrating an insertion hole forming step in the flowchart shown in FIG. 5, showing an insertion hole forming mold and a base board wafer.
Figure 7:
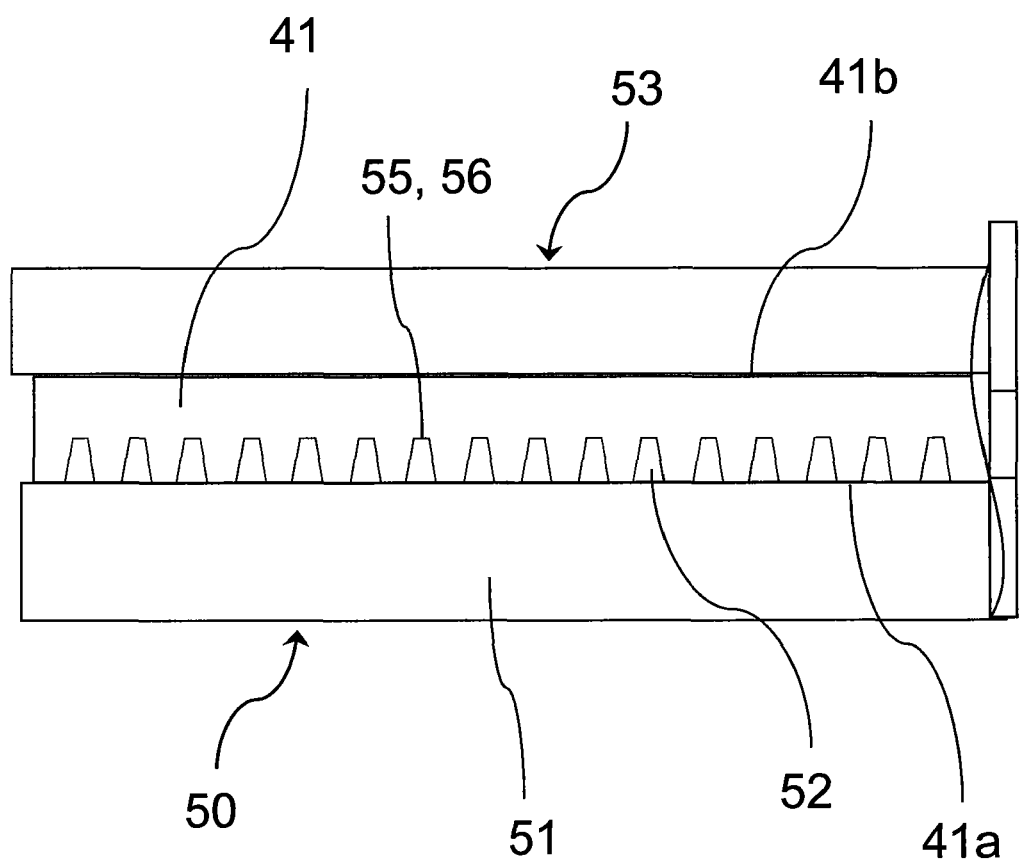
FIG. 7 is a diagram illustrating the insertion hole forming step in the flowchart shown in FIG. 5, showing a state where the insertion hole forming mold forms insertion holes in the base board wafer.

In the insertion hole forming step, first, as shown in FIG. 6, the insertion hole forming mold 50 is placed with the convex portions 52 positioned on the upper side, and the base board wafer 41 is placed thereon. In addition, the receiving mold 53 is placed on the base board wafer 41. This assembly is placed in a heating furnace with pressure applied in a high temperature state of about 900° C., and as shown in FIG. 7, the shapes of the convex portions 52 are transferred to the one surface 41a of the base board wafer 41 to form depressions, namely the insertion holes 55 and 56 not penetrating through the base board wafer 41.

At that time, since the receiving mold 53 and the insertion hole forming mold 50 are made of a carbon material, the base board wafer 41 heated and softened does not adhere onto the receiving mold 53 and the insertion hole forming mold 50. Therefore, the receiving mold 53 and the insertion hole forming mold 50 can be easily removed from the base board wafer 41. Moreover, since the receiving mold 53 and the insertion hole forming mold 50 are made of a carbon material, it is possible to prevent the base board wafer 41 in the high temperature state from absorbing gas generated therefrom and forming pores in the base board wafer 41, thus decreasing porosity of the base board wafer 41. In this way, it is possible to secure air-tightness of the cavity 3a.

Subsequently, the base board wafer 41 is cooled gradually while decreasing the temperature. This cooling method will be described in detail when describing a cooling step performed after the welding step.

Core Portion Insertion Step

Figure 10:
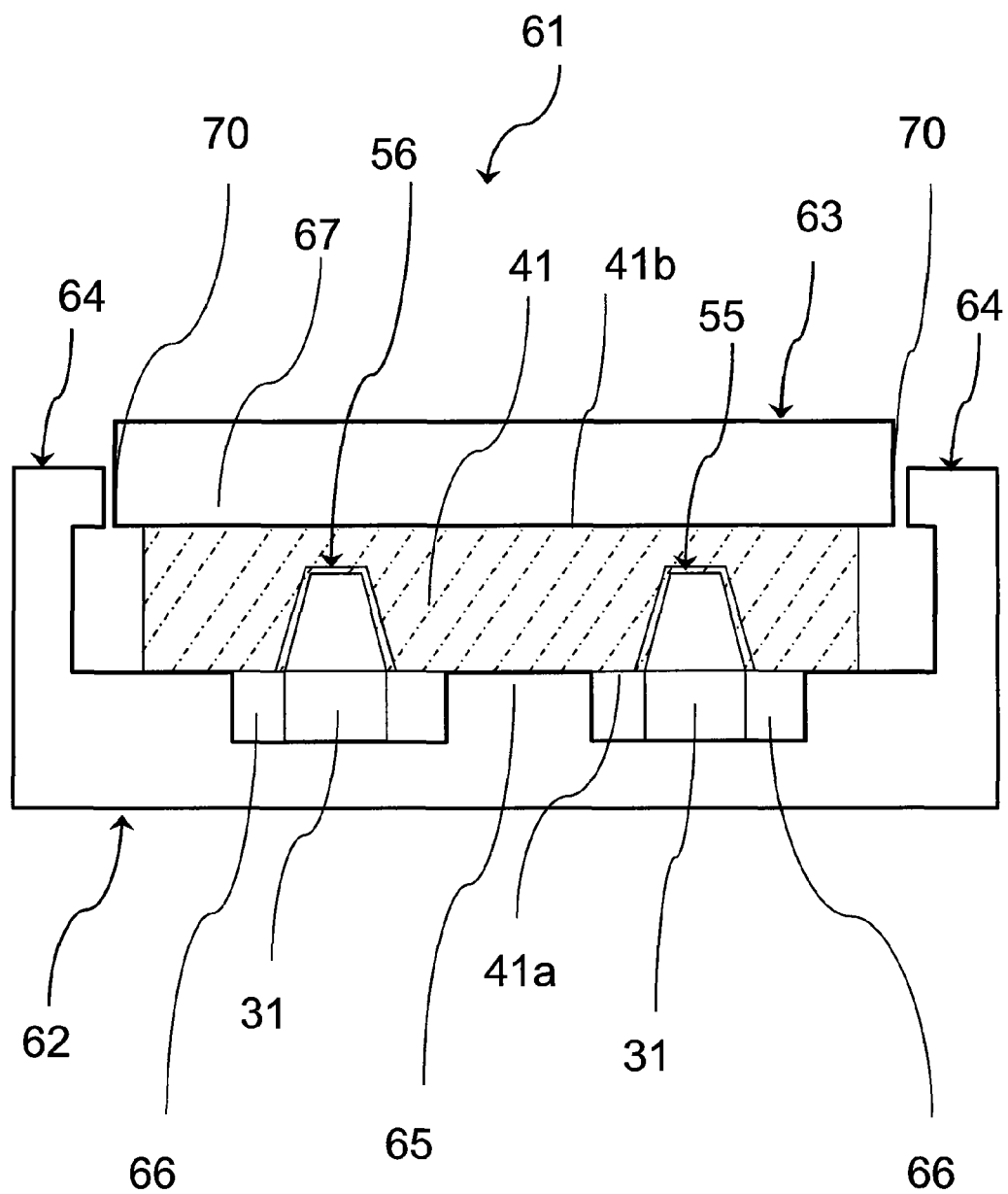
FIG. 10 is a diagram illustrating a welding step in the flowchart shown in FIG. 5.

Subsequently, a step of inserting the core portions 31 into the insertion holes 55 and 56 is performed (S12). As shown in FIG. 9, the base board wafer 41 is placed on a pressurizing mold 63 of a welding mold 61 described later, and the approximately truncated conical tip ends 81 of the core portions 31 are inserted, from the above, into the insertion holes 55 and 56. In this state, the pressurizing mold 63 and a receiving mold 62, described later, of the welding mold 61 hold the base board wafer 41 and the termination ends 82 of the core portions 31 therebetween, and this assembly is turned upside down as shown in FIG. 10.

Figure 8:
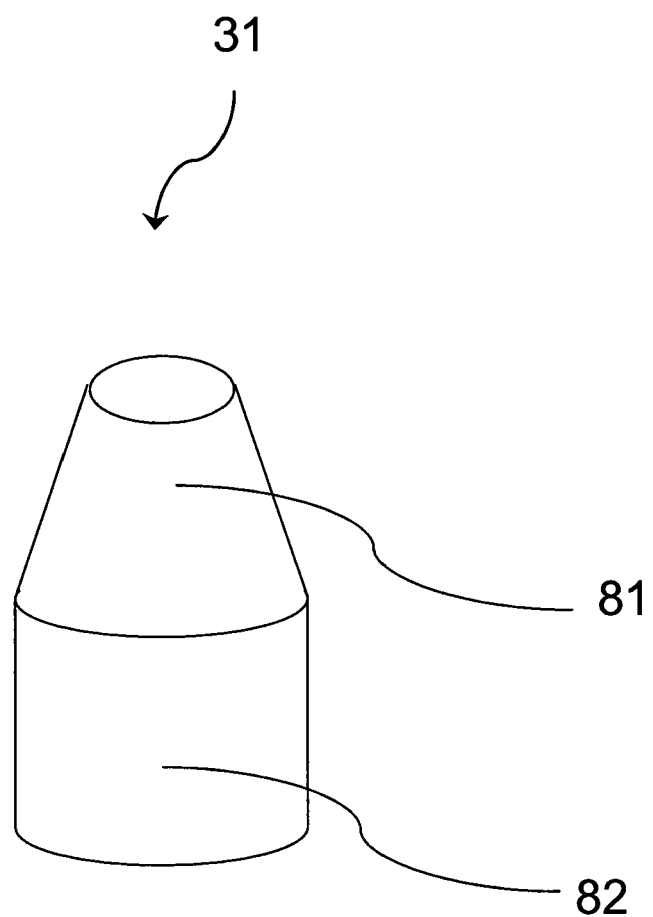
FIG. 8 is a perspective view illustrating a core portion insertion step in the flowchart shown in FIG. 5, showing a core portion inserted into the insertion hole.

FIG. 8 is a perspective view of the core portion 31. The core portion 31 has a shape which is formed by the tip end 81 having an approximately truncated conical shape and the termination end 82 having an approximately cylindrical shape connected to the large diameter side. The tip end 81 of the core portion 31 is inserted into the insertion hole 55 or 56, and the termination end 82 of the core portion 31 protrudes from the insertion hole 55 or 56. The step of inserting the core portions 31 into the insertion holes 55 and 56 is performed using an inserting machine. At this time, since the insertion holes 55 and 56 have an approximately truncated conical shape which is the same shape as the tip ends 81 of the core portions 31, the core portions 31 can be easily inserted into the insertion holes 55 and 56, and the workability is improved.

Welding Step

Subsequently, a step of heating the base board wafer 41 so that the base board wafer 41 is welded to the core portions 31 is performed (S13). As shown in FIG. 10, the welding step is performed by placing the base board wafers 41 one by one in the welding mold 61 made of a carbon material and having the receiving mold 62 disposed on the lower side of the base board wafer 41, the pressurizing mold 63 disposed on the upper side of the base board wafer 41, and side plates 64 provided on the sides of the receiving mold 62 and the pressurizing mold 63 and heating the base board wafer 41 while pressing the base board wafer 41.

The receiving mold 62 is a mold that holds the lower side of the base board wafer 41 and the termination ends 82 of the core portions 31. The receiving mold 62 has a shape such that it is larger than the base board wafer 41 in top view and it extends along the lower side of the base board wafer 41 in which the tip ends 81 of the core portions 31 are inserted into the insertion holes 55 and 56, and the termination ends 82 of the core portions 31 protrude from the surface 41a of the base board wafer 41. The receiving mold 62 includes a receiving mold planar portion 65 which is a flat member making contact with the one surface 41a of the base board wafer 41 when holding the base board wafer 41 and receiving mold recess portions 66 which make contact with the termination ends 82 of the core portion 31 and are recess portions corresponding to the approximately cylindrical termination ends 82.

The receiving mold recess portions 66 are formed in alignment with the positions of the core portions 31 provided in the insertion holes 55 and 56 of the base board wafer 41. The depth of the receiving mold recess portion 66 is identical to the height of the termination end 82 of the core portion 31 protruding from the one surface 41a of the base board wafer 41. On the other hand, the width of the receiving mold recess portion 66 is about 600 μm larger than the width (diameter) of the termination end 82 of the core portion 31. This is to absorb misalignment of the positions of the core portions 31 and the positions of the receiving mold recess portions 66 during the welding step since the thermal expansion coefficient of the carbon material of the receiving mold 62 is different from that of the glass material of the base board wafer 41. In this way, the receiving mold 62 is able to hold the core portions 31 while absorbing the difference in the thermal coefficients of the materials and preventing the core portions 31 from springing out.

The pressurizing mold 63 is a mold that presses the upper side of the base board wafer 41. The pressurizing mold 63 includes a pressurizing mold planar portion 67 which is a flat member making contact with the other surface 41b of the base board wafer 41 when pressing the upper side of the base board wafer 41. In this way, the other surface 41b of the base board wafer 41 is pressed by the flat surface of the pressurizing mold planar portion 67. Moreover, the pressurizing mold 63 includes a slit 70 which is provided at an end thereof so as to penetrate through the pressurizing mold 63. The slit 70 can be used as an escape hole for the air and surplus glass material of the base board wafer 41 when the base board wafer 41 is heated and pressed.

In the welding step, first, the base board wafer 41 and the core portions 31 set on the welding mold 61 are placed on a mesh belt made of metal, and in such a state, they are inserted in a heating furnace and heated. Moreover, using a press machine or the like disposed in the heating furnace, the base board wafer 41 is pressed by the pressurizing mold 63 at a pressure of 30 to 50 g/cm$^2$, for example. The heating temperature is set to a temperature (for example, about 900° C.) higher than the softening point (for example, 545° C.) of the glass material of the base board wafer 41.

The heating temperature is increased gradually, and the temperature increase stops temporarily at a time when the heating temperature reaches a temperature (for example, 550° C.) that is about 5° C. higher than the softening point of the glass material, and then the temperature increase goes on to about 900° C. In this way, by temporarily stopping the temperature increase at a temperature about 5° C. higher than the softening point of the glass material and maintaining the temperature, the softening of the base board wafer 41 can be made uniform.

Since the base board wafer 41 is pressed in the high temperature state, the base board wafer 41 is welded to the core portions 31, so that the core portions 31 close the insertion holes 55 and 56. By forming another convex or recess portion on the welding mold 61, a recess or convex portion may be formed on the base board wafer 41 when the base board wafer 41 is welded to the core portions 31.

Cooling Step

Figure 11:
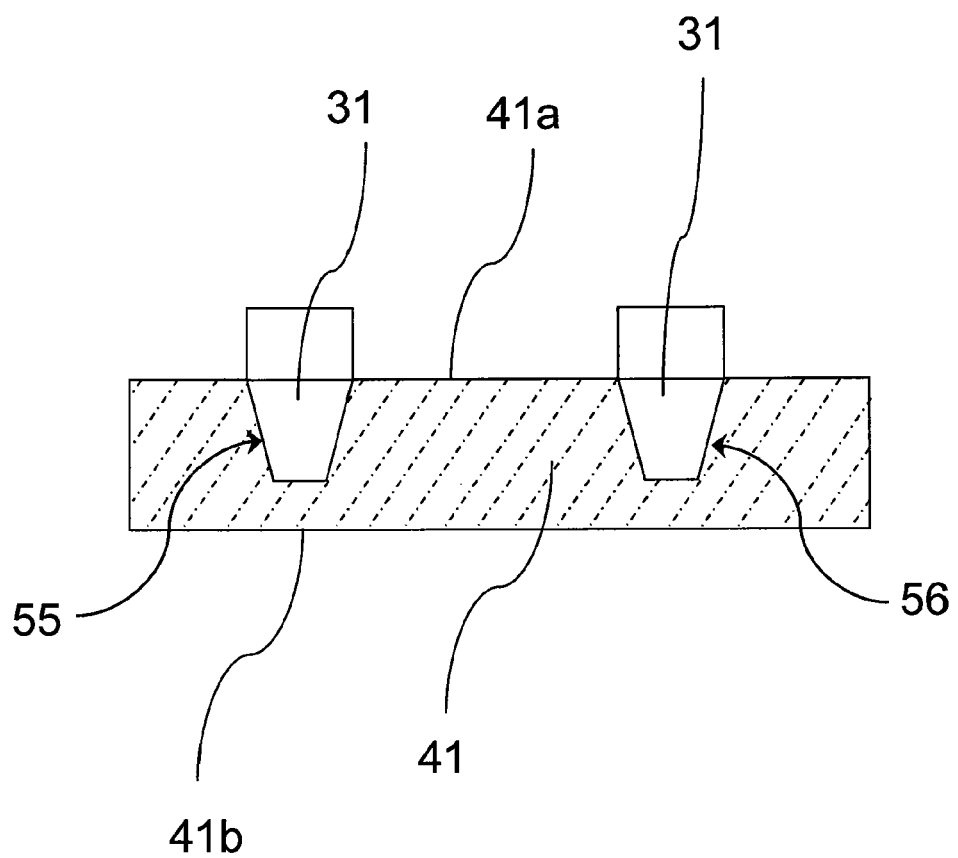
FIG. 11 is a diagram illustrating a polishing step in the flowchart shown in FIG. 5, showing a state before the polishing step is performed.

Subsequently, the base board wafer 41 is cooled (S14). The cooling of the base board wafer 41 is performed by gradually decreasing the temperature from about 900° C. which is the heating temperature during the welding step. In this way, the base board wafer 41 is formed as shown in FIG. 11 in which the termination ends 82 of the core portions 31 close the insertion holes 55 and 56. Here, the other surface 41*b* of the base board wafer 41 is flat. In the insertion hole forming step, the cooling of the heated base board wafer 41 is performed in accordance with the above-described cooling method.

Polishing Step

Subsequently, the surfaces 41*a* and 41*b* of the base board wafer 41 are polished from both sides so that the protruding portions (the termination ends 82) of the core portions 31 are polished and removed, and the core portions 31 are exposed to the surfaces 41*a* and 41*b* of the base board wafer 41 (S15). Polishing of the surfaces 41*a* and 41*b* of the base board wafer 41 and the protruding portions of the core portions 31 is performed in accordance with the known method.

First, the protruding portions (the termination ends 82) of the core portions 31 and the one surface 41*a* of the base board wafer 41 are polished using the other surface 41*b*, which is flat, of the base board wafer 41 as a reference surface. In this way, the one surface 41*a* of the base board wafer 41 becomes approximately even with the surfaces of the core portions 31 (penetration electrodes 8 and 9).

Figure 12:
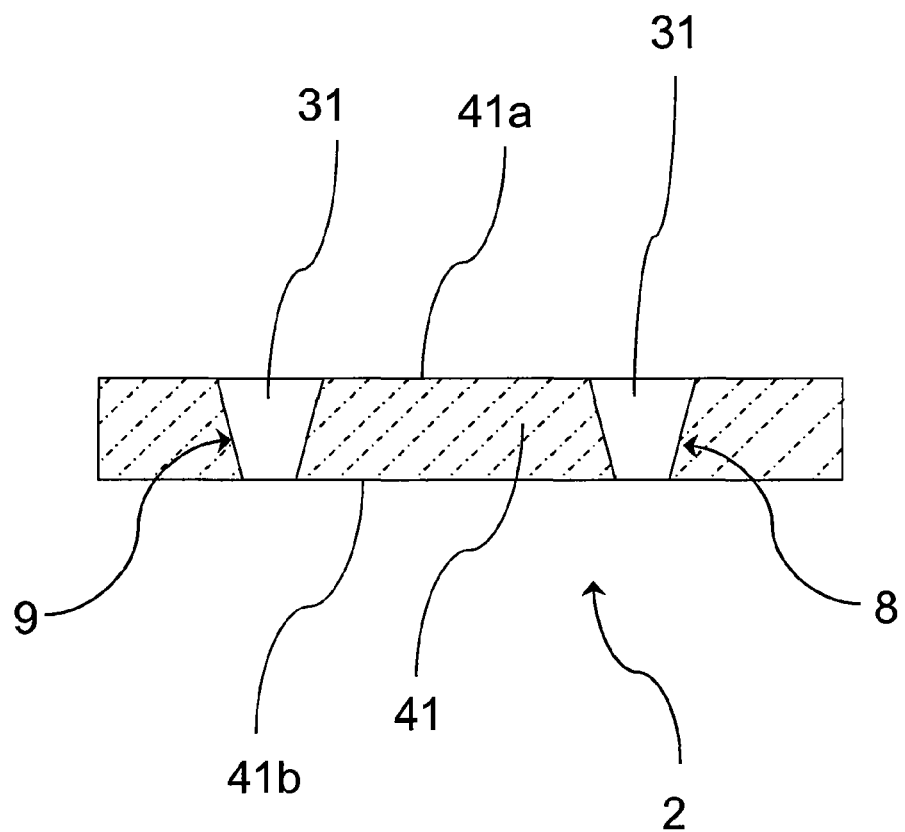
FIG. 12 is a diagram illustrating the polishing step in the flowchart shown in FIG. 5, showing a state after the polishing step is performed.

Subsequently, the other surface 41*b* of the base board wafer 41 is polished so that the core portions 31 are exposed to the other surface 41*b* of the base board wafer 41. In this way, the surfaces 41*a* and 41*b* of the base board wafer 41 become approximately even with the surfaces of the core portions 31 (penetration electrodes 8 and 9) as shown in FIG. 12.

Subsequently, a lead-out electrode forming step is performed where the lead-out electrodes are formed on the other surface 41*b* of the base board wafer 41 (S16). Moreover, an outer electrode forming step is performed where a conductive material is patterned onto the one surface 41*a* of the base board wafer 41 so as to form the outer electrodes 21 and 22 (S17). In this way, a step of manufacturing the base board wafer 41 (the base board 2) ends.

Subsequently, at the same or a different time as the manufacturing of the base board 2, a lid board wafer later serving as the lid board 3 is manufactured. In the step of manufacturing the lid board 3, first, a disk-shaped lid board wafer later serving as the lid board 3 is formed. Specifically, a soda-lime glass is polished to a predetermined thickness and cleaned, and then, the affected uppermost layer is removed by etching or the like (S20). Subsequently, the recess portion 3*a* to be used as the cavity 3*a* is formed in the lid board wafer by etching, press working, or the like (S21). After that, both surfaces of the lid board wafer are polished to a desired thickness (S22). Subsequently, a bonding film 23 is formed over an entire surface of the lid board wafer to be bonded to the base board wafer (S23).

The piezoelectric vibrating reed 4 is disposed in the cavity 3*a* formed between the base board 2 and the lid board 3 formed in this way so as to be mounted on the pad electrodes 13 and 14 (S30). The base board 2 and the lid board 3 are bonded to each other by anodic bonding or fusion joining to form a wafer assembly (S31). Moreover, a cutting step where the wafer assembly is cut in small fragments is performed (S32), and an inner electrical property test is conducted, whereby a package (piezoelectric vibrator 1) in which the piezoelectric vibrating reed 4 is accommodated is formed (S33).

In the package manufacturing method according to the present embodiment, the insertion holes 55 and 56 for inserting the core portions 31 later serving as the penetration electrodes 8 and 9 into the base board wafer 41 are formed as depressions that do not penetrate through the base board wafer 41. Therefore, the other surface 41*b* of the base board wafer 41 becomes flat with no swelling of the glass material. When the base board wafer 41 is welded to the core portions 31 inserted into the insertion holes 55 and 56, the other surface 41*b*, which is flat, of the base board wafer 41 is pressed by the similarly flat pressurizing mold planar portion 67 of the pressurizing mold 63. As a result, the other surface 41*b* of the base board wafer 41 after the cooling step becomes flat. By using the other surface 41*b* as a reference surface during the polishing, both surfaces of the base board wafer 41 can be polished easily. Thus, it is possible to easily manufacture the base board 2 to which the penetration electrodes 8 and 9 are attached and which has excellent shape accuracy with a high degree of flatness without forming cracks which cause short-circuiting or the like.

Moreover, the insertion holes 55 and 56 have an approximately truncated conical shape of which the diameter on a side opened to the one surface 41*a* of the base board wafer 41 is large, and the core portions 31 have the truncated conical tip ends 81 corresponding to the insertion holes 55 and 56. In addition, the core portions 31 have the approximately cylindrical termination ends 82 connected to the large diameter side of the approximately truncated conical tip ends 81 which are inserted into the insertion holes 55 and 56.

Therefore, it is possible to easily insert the core portions 31 into the insertion holes 55 and 56 of the base board wafer 41. In addition, it is possible to hold the approximately cylindrical termination ends 82 with the receiving mold recess portions 66 of the receiving mold 62 during the welding. Thus, the core portions 31 are rarely displaced during the welding.

Oscillator

Figure 13:
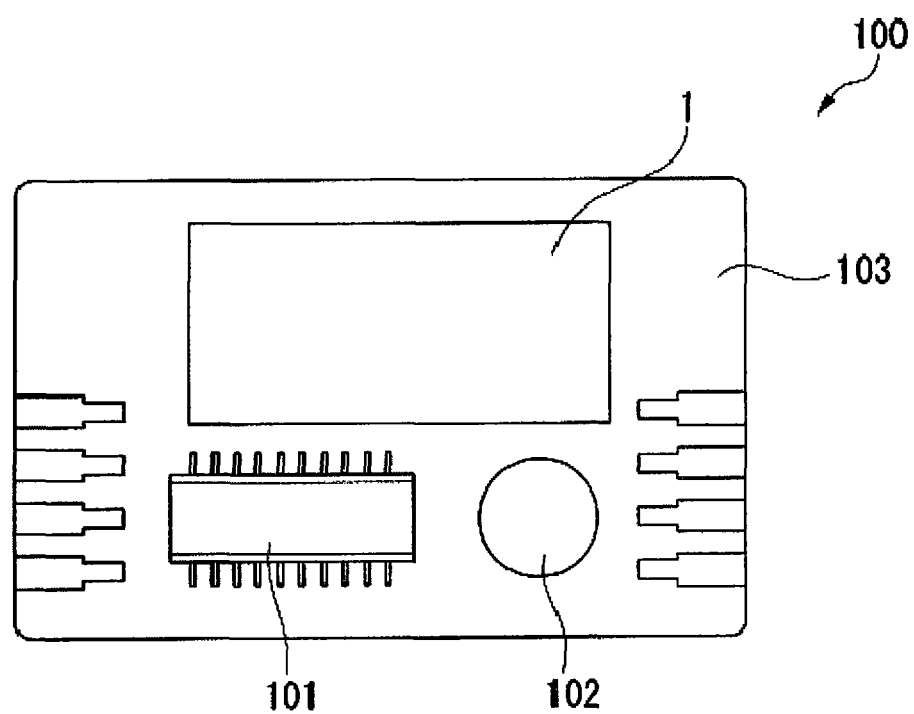
FIG. 13 is a diagram showing an example of an oscillator according to an embodiment of the present invention.

Next, an embodiment of the oscillator according to the present invention will be described with reference to FIG. 13. As shown in FIG. 13, an oscillator 100 of the present embodiment is one in which the piezoelectric vibrator 1 is configured as an oscillating piece that is electrically connected to an integrated circuit 101. The oscillator 100 includes a board 103 on which an electronic component 102 such as a capacitor is mounted. The integrated circuit 101 for the oscillator is mounted on the board 103, and the piezoelectric vibrator 1 is mounted in the vicinity of the integrated circuit 101. The electronic component 102, integrated circuit 101, and piezoelectric vibrator 1 are electrically connected by a wiring pattern which is not shown. It should be noted that these components are molded by resin which is not shown.

In the oscillator 100 configured in this manner, the piezoelectric vibrating reed 5 in the piezoelectric vibrator 1 vibrates when a voltage is applied to the piezoelectric vibrator 1. This vibration is converted to an electrical signal by the piezoelectric characteristics of the piezoelectric vibrating reed 5 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece. By selectively setting the configuration of the integrated circuit 101, for example, an RTC (Real Time Clock) module, according to the demands, it is possible to add a function of controlling the date or time for operating the device or an external device or providing the time or calendar other than a single-function oscillator for a timepiece.

According to the oscillator 100 of the present embodiment, the oscillator 100 includes the high-quality piezoelectric vibrator 1 in which the air-tightness of the inside of the cavity 4 is reliable, stable conduction between the piezoelectric vibrating reed 5 and the outer electrodes 6 and 7 is secured, and operation reliability is improved. Therefore, stable conduction can be secured in the oscillator 100 itself, and it is possible to improve operation reliability to achieve high quality. In addition to this, it is possible to obtain a highly accurate frequency signal which is stable over a long period of time.

The embodiment of the package manufacturing method according to the present invention has been described hereinabove. However, the technical scope of the present invention is not limited to the embodiments above, and the present invention can be modified in various ways without departing from the spirit of the present invention. What matters is that it is necessary to obtain desired functions of the present invention.

What is claimed is:

1. A method for producing electronics packages, comprising:
   (a) defining a plurality of first substrates on a first wafer and a plurality of second substrates on a second wafer;
   (b) forming at least one non-penetrating electrode hole in a respective at least some of the first substrates, wherein the at least one non-penetrating electrode hole is substantially frustoconical with diameters being smaller towards a bottom of the diameter and press-formed with at least one frustoconical projection pressed into the first wafer under heat;
   (c) inserting one end portion of a conductive pillar in a respective at least some of the non-penetrating electrode holes, wherein the one end portion of the conductive pillar is of a substantially frustoconical shape similar to but slightly smaller than an inner periphery of the non-penetrating electrode hole so as for there to be a gap between the inserted conductive pillar and the inner periphery of the non-penetrating electrode hole;
   (d) heating the first wafer and pressing the conductive pillar into the respective at least some of the non-penetrating electrode holes under heat to close the gap;
   (e) removing one surface of a respective at least some of the first substrates in a depth sufficient to expose one end of each of the conductive pillars from the removed one surfaces;
   (f) layering the first and second wafers such that at least some of the first substrates substantially coincide respectively with at least some of the corresponding second substrates to form respective pairs, with a cavity being formed between at least some of the coinciding first and second substrates; and
   (g) cutting off a respective at least some of the layered pairs of the coinciding first and second substrates from the first and second wafers.

2. The method according to claim 1, wherein layering the first and second wafers comprises hermetically bonding the first and second substrates of the layered pairs of the coinciding first and second substrates.

3. The method according to claim 1, wherein layering the first and second wafers comprises placing a piezoelectric vibrating reed between the first and second substrates of the layered pairs of the coinciding first and second substrates.

4. The method according to claim 1, wherein the at least one frustoconical projection is a die is made of carbon.

5. The method according to claim 1, wherein the non-penetrating electrode hole has an inner diameter larger by 20-30 μm than an outer diameter of the conductive pillar that forms the gap.

6. The method according to claim 1, wherein the conductive pillar has a thermal expansion coefficient close to a thermal expansion coefficient of the first wafer in that the thermal expansion coefficient of the conductive pillar is substantially equal to or lower than that of the thermal expansion coefficient of the first wafer.

7. The method according to claim 1, wherein heating the first wafer comprises two steps of heating processes which comprise heating the first wafer to a first temperature substantially close to a softening point of the first wafer, maintaining the first temperature for a time period and then heating the first wafer to a second temperature higher than the first temperature.

8. The method according to claim 7, wherein the first wafer is made of glass, and wherein the first temperature is 5° C. higher than the softening point of glass, and the second temperature is about 900° C.

9. The method according to claim 1, wherein pressing the conductive pillar into the respective at least some of the non-penetrating electrode holes comprises pressing the conductive pillar under a pressure of 30 to 50 g/cm$^2$.

10. The method according to claim 1, wherein the conductive pillar is longer than a depth of the electrode hole and the method further comprising, after step (c), grinding off a part of the conductive pillar extending from the first wafer.

* * * * *